United States Patent [19]

Kapfer

[11] 4,038,598
[45] July 26, 1977

[54] PROBE CONTACT AND JUNCTION DETECTOR

[75] Inventor: Vincent C. Kapfer, Chadwicks, N.Y.

[73] Assignee: The United States of America as represented by the Secretary of the Air Force, Washington, D.C.

[21] Appl. No.: 667,820

[22] Filed: Mar. 16, 1976

[51] Int. Cl.² ............... G01R 31/02; G01R 19/16
[52] U.S. Cl. ........................ 324/72.5; 324/73 R; 324/133
[58] Field of Search ............ 324/158 P, 158, 72.5, 324/149, 73 R, 133; 340/248 A

[56] References Cited

U.S. PATENT DOCUMENTS 3,787,735  1/1974  DeWitte et al. ............... 324/73 R
3,838,339  9/1974  Brandt .............................. 324/133

Primary Examiner—Rudolph V. Rolinec
Assistant Examiner—Ernest F. Karlsen
Attorney, Agent, or Firm—Joseph E. Rusz; Willard R. Matthews, Jr.

[57] ABSTRACT

The detection and indication of a probe contact to metalization and to junctions on chips during microcircuit analysis is achieved by means of a circuit comprising a complementary MOS transistor logic circuit and light emitting diodes (LEDs). A polarity switching circuit provides probe contact indication in response to "0" and "1" logic levels for both forward and reverse bias conditions. Other switching circuits provide sensitivity level selection and the transfer of probe output to an alternate microcircuit analysis device. An auxiliary sound indicator is connected in parallel with the visual LED indicators. Probe assembly capacitance is minimized by a plexiglass insulator that inserts a fixed capacitance between each probe contact.

7 Claims, 10 Drawing Figures

4,038,598

PROBE CONTACT AND JUNCTION DETECTOR

STATEMENT OF GOVERNMENT INTEREST

The invention described herein may be manufactured and used by or for the Government for governmental purposes without the payment of any royalty thereon.

BACKGROUND OF THE INVENTION

This invention relates to apparatus for performing device and failure analysis of microcircuit chips, and in particular to means for detecting and indicating the contact of a microcircuit analyzer probe to metalization and to junctions on chips under test.

Apparatus for performing microcircuit analysis and testing has, in the past, been unreliable and has, in certain instances, caused damage to or has destroyed the device under test. Commonly, the device under test is probed with tungsten probes the output of which is fed to a curve tracer. When contact to metalization that is only a few microns square is required, Kelvin probes are found to be too bulky. Ambiguity in the curve tracer output could therefore result because of the uncertainties as to whether a failure was a failure in the device being tested or a failure of the probe to make proper contacts. Another problem with state-of-the art devices is that of detecting a positive contact to a junction when reverse bias leakage current may be only a few nanoamperes. When observing this leakage current on a curve tracer there is no indication that contact has been made until the voltage reaches 15 or 20 volts. If there is poor ohmic contact under these conditions the higher voltage could cause sparking at the probe contact and damage the device being tested.

In essence, therefore, the basic and most pressing problem currently encountered in microcircuit analysis is that of making positive contact to the microcircuit metalization, contact cuts through the oxide junction contacts, or contacts to a diffused resistor with greater ease, with greater reliability and with little chance of damaging the device under test. The present invention is directed toward solving this problem.

SUMMARY OF THE INVENTION

The invention comprehends solid state electronic devices adapted to use in detecting contact to the metalization on a chip or for detecting contact to a junction when performing device or failure analysis on a microcircuit. It comprises a detector that utilizes the complementary MOS devices and solid state light emitting diodes (LEDs) that are used in basic logic probes. The LEDs are used for indicating a 0 or 1 logic level. The detector is used in conjunction with micropositioners that use tungsten probes to make an electrical contact with the microcircuit chip at specific locations. The tungsten probes are electrically connected into the input of the detector. Positive contact to metalization or a junction is denoted by either a 0 or a 1 indication on the LED display of the detector. A switching arrangement is incorporated within the detector assembly to connect a curve tracer to the element under test where the electrical characteristics may be analyzed. The detector also incorporates a polarity switch for applying a forward or reverse bias to a junction.

It is a principal object of the invention to provide a new and improved probe contact and junction detector.

It is another object of the invention to provide a probe contact and junction detector that is capable of making positive contact to microcircuit metalization with greater ease and with greater reliability than is possible with currently available devices.

It is another object of the invention to provide a probe contact and junction detector that will not damage the elements under test.

These, together with other objects, features and advantages of the invention will become more readily apparent from the following detailed description when taken in conjunction with the illustrated embodiment of the accompanying drawings.

DETAILED DESCRIPTION OF THE DRAWINGS

DETAILED DESCRIPTION OF THE PREFERRED EMBODIMENT

Figure 2:
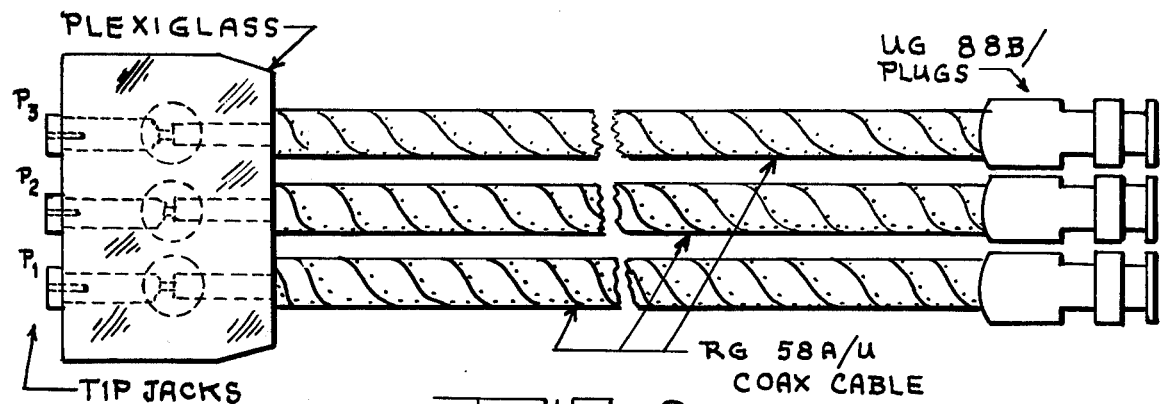
FIG. 2 is an illustrative drawings of the probe assembly of the invention.
Figure 3:
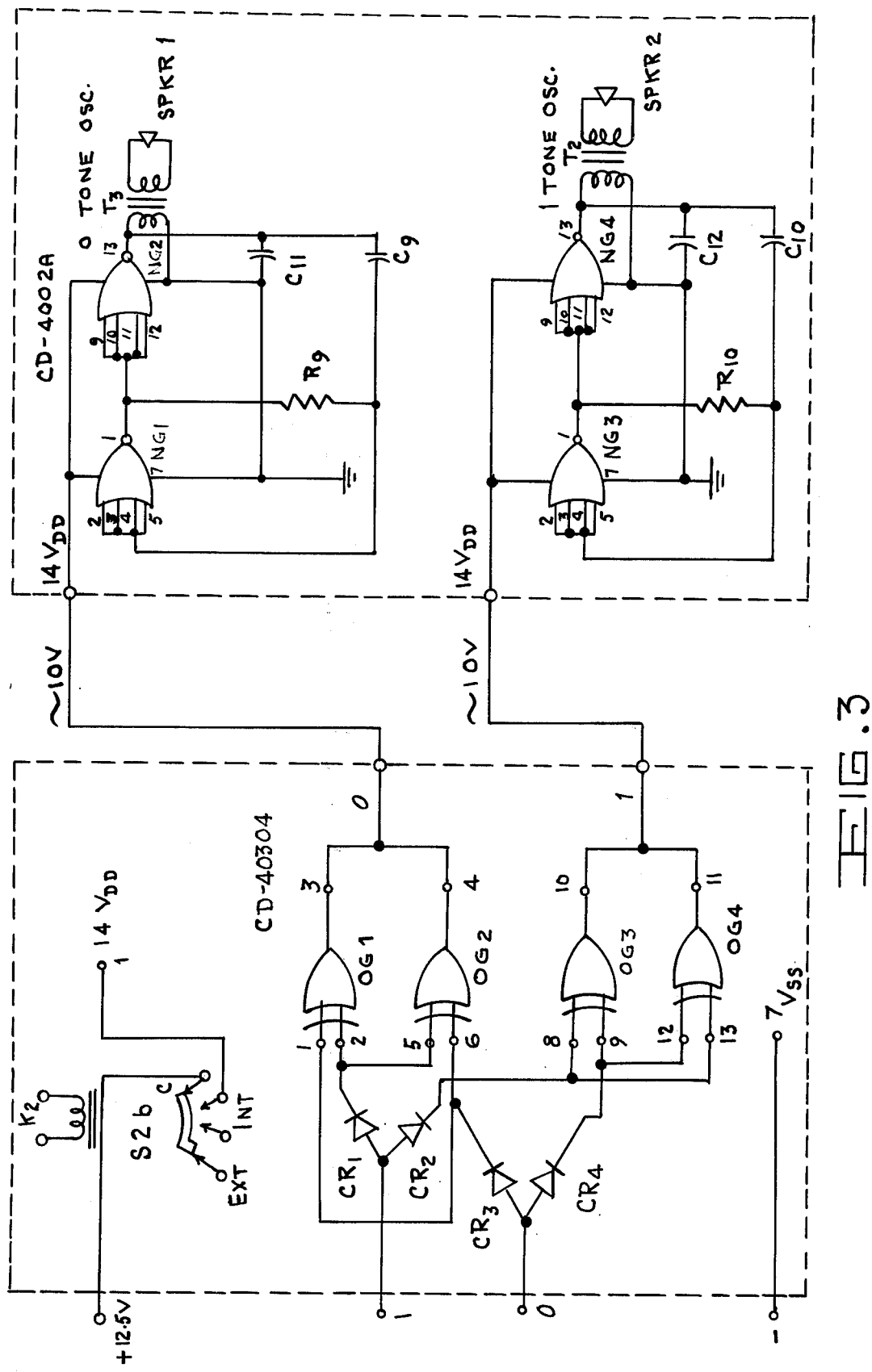
FIG. 3 is a schematic diagram of the tone oscillator of the invention.

The probe contact and junction detector of the present invention comprises, in combination, a probe assembly, C/MOS logic circuits, LED visual indicators, an auxiliary tone generator audio indicator and polarity, external disconnect and sensitivity selection switching circuits. The C/MOS logic circuits, the LED visual indicators and the switching circuits are illustrated schematically in FIG. 1. FIG. 2 illustrates the probe assembly and FIG. 3 illustrates the tone generator. Basically, the probe detector of the invention is realized by applying C/MOS technology in conjunction with solid state light emitting diodes. The whole assembly is small and the indicator can be placed close to the microscope used on microcircuit testing and analysis thus saving time in contacting the circuit. After contact is made the switching arrangement permits reconnection of the probe outputs to curve tracer which can then be used to analyze the junction characteristics.

The detector has two modes of operation, i.e., a forward bias or a reverse bias can be applied to the junction. In either of these modes it is possible to have either a zero and/or one indication. For a single junction there should be at least two positions where positive contact to the chip can be detected. In the case of resistive contact only, contact is indicated in either forward or reverse bias mode giving a 0 or a 1.

The following table indicates the connection arrangements of the various probes for contacting junctions;

| SWITCH SETTINGS | SINGLE JUNCTION (C-B) OR (E-B) | | | |
|---|---|---|---|---|
| | POLARITY OF PROBE VOLTAGE TO SEMICONDUCTOR | BIASING | LOGIC LEVEL | |
| 0-R | $P_1(+)$ to N $P_2(-)$ to P | Reverse (R) | 0 | |
| I-R | $P_1(+)$ to N $P_2(-)$ to N | Reverse (R) | 1 (No current voltage) | |
| I-F | $P_1(-)$ to N $P_2(+)$ to P | Forwrd (F) | 1 ($V_{for-voltage\ drop}$) | |

| SWITCH SETTINGS | DOUBLE JUNCTION (C-E) *NPN - TRANSISTOR | | |
|---|---|---|---|
| | POLARITY OF PROBE VOLTAGE TO SEMICONDUCTOR | BIASING | LOGIC LEVEL |
| I-R | $P_1(+)$ to N (C) $P_2(-)$ to N (E) | Reverse (R) Collector | 1 |
| I-F | $P_1(-)$ to N (C) $P_2(+)$ to N (E) | Forward (F) Collector | 1 |

*NOTE: For this measurement Probe $P_3$ is connected to a resistor network to the shield of P-1 and also to ground. For PNP transistors reverse all connections.

For making resistive contacts to metalization or thin film or diffused resistors there are three combinations for probing as follows:

| PROBE COMBINATIONS | SWITCH SETTING | POLARITY OF PROBE VOLTAGE | LOGIC LEVEL |
|---|---|---|---|
| $P_1$-$P_2$ | 0 or 1 | $P_1(+)$ (R) $P_2(-)$ (R) | 0 or 1 |
| $P_1$-$P_2$ | 0 or 1 | $P_1(-)$ (F) $P_2(+)$ (F) | 0 or 1 |
| $P_1$-$P_3$ | 0 or 1 | $P_1(+)$ (R) $P_3(-)$ | 0 or 1 |
| $P_2$-$P_3$ | 0 or 1 | $P_2(+)$ (F) $P_3(-)$ | 0 or 1 |

It has been observed that in some instances the capacitance of some conventional probe assemblies may be of sufficient magnitude to give a "zero" or "one" indication. This problem may be overcome by having insulated probes with only the tips (tungsten) being conductive in order to reduce the capacitance of < 15 pf.

An important advantage of the detector is its very high input impedance (about $10^{12}$ ohms). This impedance is several orders of magnitude greater than the impedance of the device being tested. This high impedance is advantageous as it limits the current to nanoamperes in the device under test (DUT), and prevents the device from being damaged due to excessive current, which may be the case under certain conditions, when using a curve tracer.

Figure 1:
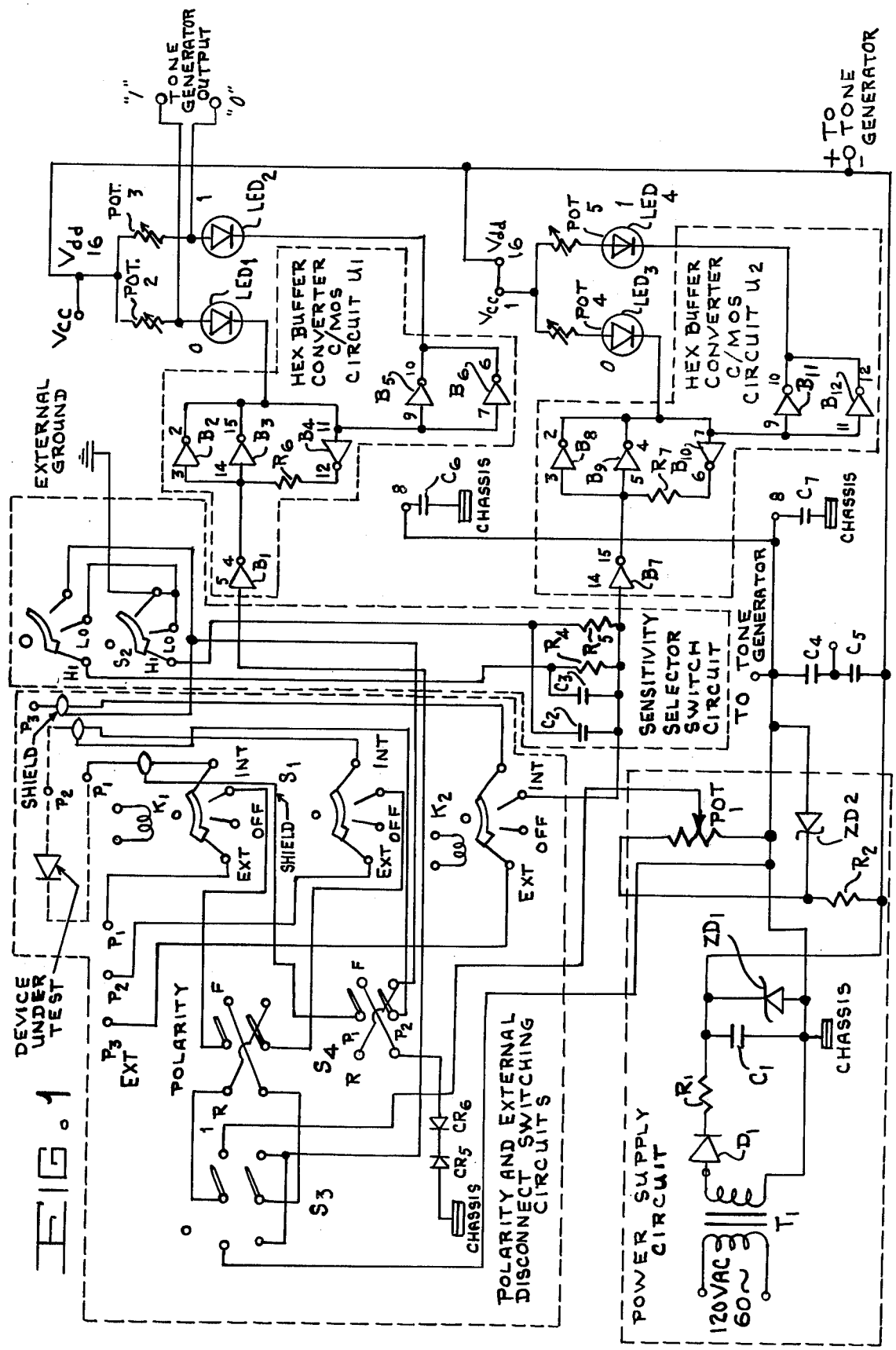
FIG. 1 is a schematic diagram of the C/MOS logic and switching circuits of the invention.
Figure 4:
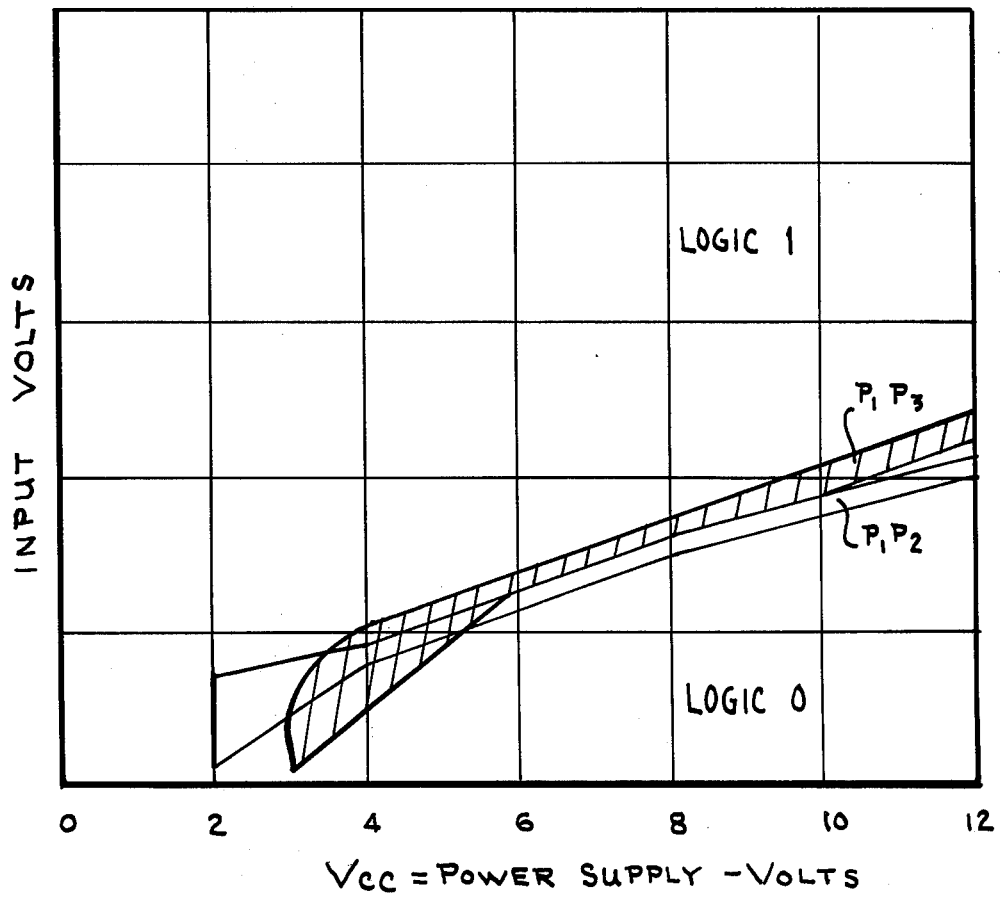
FIG. 4 is a graph illustrating hysteresis voltage responses for certain probe connections.

Referring now to the schematic diagram of FIG. 1, it is noted that a low power C/MOS hex buffer is used for the Schmitt trigger configuration in conjunction with a voltage divider network and associated switching for 0 and 1 indication on the LED's. This circuit arrangement allows both forward and reverse bias to be applied to the junction to be contacted. The inverters in the C/MOS device (total of 6) are used for 0 and 1 logic level converters and are also used to increase the current drive for the light emitting diodes LEDs 1-4. The Schmitt trigger circuit configuration employs regenerative feedback; that is, one of the inverter's output is being fed back to an input through a resistor. There exists a hysteresis voltage or the undefined region which is an area between the V off and V on voltage or the 0 and 1 logic levels. If this hysteresis is reduced to zero, then there will be no 0 or 1 logic level indication. FIG. 4 illustrates a graph of the input voltage versus power supply voltage as plotted for probes P-1-P-2 and P-1-P-3. The area between the logic 0 and logic 1 levels is the hysteresis mode where both the 0 and 1 are lighted indicating no probe contact or signifying an undefined region. This area in the hysteresis mode has been considerably reduced by a regenerative feedback stage in the logic level conversion.

Figure 5:
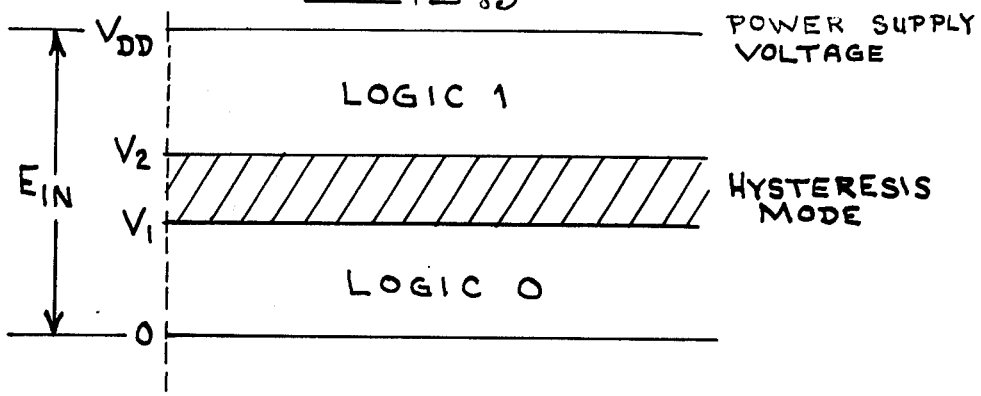
FIG. 5 is a diagram depicting various voltage levels and a hysteresis voltage zone.

The diagram of FIG. 5 depicts the various voltage levels and hysteresis voltage zone. The hysteresis voltage is illustrated by the shaded area between the lower and upper threshold voltage levels $V_1$ and $V_2$, respectively. Having reference to FIG. 5, $V_{DD}$ is the power supply voltage that is applied to the low power hex buffer logic level converters (4009A); E is the voltage applied to the input of the hex buffer and can be varied between 0 volts and $V_{DD}$ power supply voltage; and 0 to $V_1$ is the input voltage to the hex buffer which will give a logic 0 level at the output of the hex buffer, logic level converter as indicated by the 0 light emitting diode (LED) indicator. Delta ($V_2$ - $V_1$) is the difference voltage between the upper trigger level or threshold voltage to give a 1 level at the output and the lower trigger level or threshold voltage to give a 0 level at the output. This is called the hysteresis voltage or dead zone. This hysteresis voltage is developed by the Schmitt trigger regenerative circuit. This circuit is well known to circuit designers. The hysteresis voltage for the particular application here is adjusted by the feedback resistors connected from the output of the hex buffer logic level converter, both the 0 and 1 light emittiong diodes will be lit as neither a 0 or 1 voltage level is defined in the dead zone region. $V_2$ to $V_{DD}$ is the voltage at the input to the hex buffer which will give a logic 1 level at the output of the hex buffer logic level converter as indicated by the 1 light emitting diode (LED) indicator.

The use of the probe detector makes contacting a chip easier prior to using a curve tracer for detecting the device characteristics. The probe can also be used for checking continuity of capacitors, resistors, leads, cables, diodes and transistors. It will not damage any of these as the current is on the order of nanoamperes.

An important advantage of the present invention over a curve tracer is illustrated by the following operating conditions. In the event that the reverse bias current is in the order of nanoamperes and the breakdown voltage is greater than 20 volts, there will be no indication on the curve tracer until breakdown, thereby requiring a higher potential. If there is poor ohmic contact to the device under these conditions, the higher voltage could cause sparking at the probe contact and damage the device. Using the probe detector of the invention in its high sensitivity mode of operation a positive contact is denoted by a logic 1. The maximum voltage under a logic 1 condition is less than 15 volts. In making contact to single junctions, a positive identification of contact is achieved for greater than 90 percent of all types of junctions. In the multiple junction case, the sensitivity of this probe may be insufficient to detect the 0 or 1 logic thus retaining the hysteresis mode in the output that is both 0 and 1 LEDs turned ON. When contact is made a logic 0 is denoted by the LED turned ON for 0 and a logic 1 is denoted by LED turned ON for 1.

The probe contact detector has two sensitivity ranges, a "low" and a "high" sensitivity range. In the low sensitivity range, there are three leads available that are marked P-1, P-2, and P-3. In the low sensitivity position the probe will detect continuity to a single junction using P-1 and P-2 or P-2 and P-3 leads. In the case of a multiple junction such as an NPN or PNP transistor, the P-1 or P-2 lead may be used as a common and is connected to the base of the transistor. The two remaining leads are connected to the emitter and the collector. The sensitivity of the detector in this range should indicate a positive contact either a logic 0 or logic 1 level for greater than 90 percent of all single or multiple microcircuit junctions when connected as noted. The approximate minimum capacitance sensitivity for 0 level is 300 pf and for 1 level is 100 pf.

Figure 6:
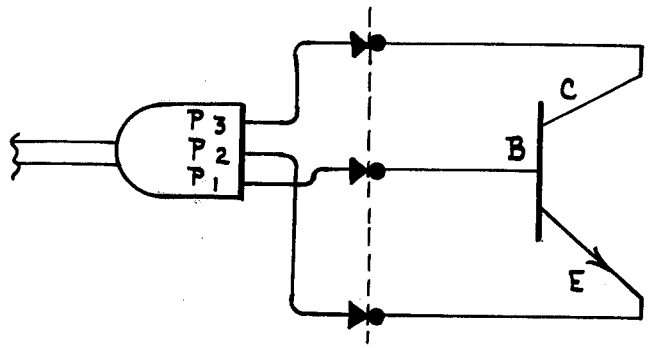
FIG. 6 is a schematic diagram indicating certain probe connection arrangements.

A schematic for connecting probes to a transistor is illustrated by FIG. 6. In the high sensitivity position only one active probe circuit is available for detecting contact. This consists of lead P-1 and P-2 which are connected to the active C/MOS microcircuit, U1. The input to the second C/MOS microcircuit $\mu 12$ is grounded through a resistance-capacitance network.

In this position the probe will detect continuity to a single junction using the P-1 and P-2 leads. Positive contact to the junction is indicated by either a logic 0 or logic 1 level. For the case of multiple junctions such as a NPN or PNP transistor, the increased sensitivity in this position allows an indication of contact by using only two leads P-1 and P-2 as compared to 3 leads for the low sensitivity range. The approximate minimum capacitance sensitivity for 0 level is 100 pf and for a 1 level is 15 pf.

Referring to the several figures of the drawings there is now presented a detailed description of the circuits and apparatus of the invention.

Figure 7:
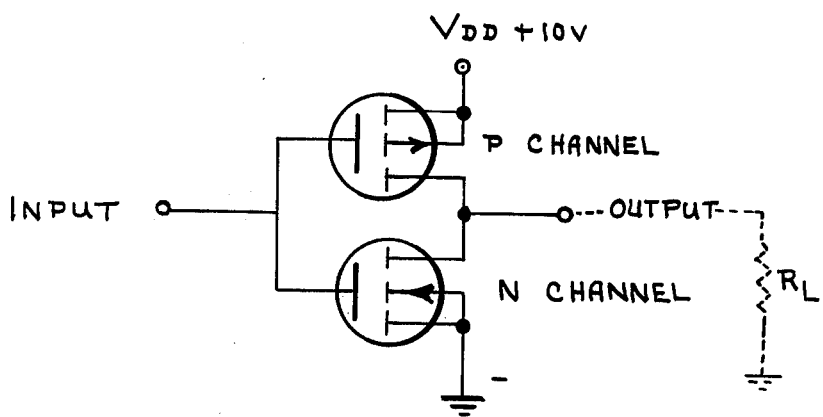
FIG. 7 is a schematic diagram of a basic C/MOS inverter circuit.

The complementary MOS logic circuits used in the detector circuit are constructed from P-channel and N-channel MOS transistors diffused on a single silicon monolithic chip. The basic inverter circuit is shown in FIG. 7. These C/MOS integrated circuits are produced commercially by several manufacturers including RCA, Motorola, and Solid State Scientific.

In the configuration of FIG. 7, 1 P-channel and 1 N-channel transistor are in series and only 1 transistor is conducting at a specific input logic that is a 0 low voltage (0 volts) or high voltage (power supply voltage). If the input is 0 volts the P-channel transistor is turned on and the N-channel transistor is turned off. In the on condition, the conductance of the channel is high (low resistance) and in the off condition the conductance is low (high resistance). As these transistors are in series, negligible current flows from $V_{DD}$ to ground (—) and for this reason they are called low power C/MOS buffer circuits. The only current drain from the $V_{DD}$ supply will be the load connected to the output as represented in the circuit diagram by the light emitting diodes (LEDs) for 0 and 1. Each 4009A C/MOS circuit contains six low power buffers. A buffer is defined as a circuit which is used to isolate between states to handle a large fanout or a number of inputs to the next stage or to convert input and output circuits for signal level compatibility.

The several circuits of the probe contact detector are illustrated by the schematic diagram of FIG. 1. They include the power supply switching, C/MOS logic and LED circuits, each of which will hereinafter be separately described. The half wave power supply circuit applies (12-13) volts to the active circuits. The parts used in this circuit consist of a power transformer T1 from 120 V to 12 VAC, half wave rectifier IN4002 D1 series surge resistors R1, R2, 15 ohms and 100 ohms, respectively, filter capacitor C1 500–1000 UF at 50 working volts DC, 100,000 ohm bleeder resistor R3 to chassis ground, a 15 volt Zener diode ZD1, and a 14 volts Zener diode ZD1 to limit DC voltage output, and a 20,000 ohm potentiometer POT1 for adjusting the voltage applied to the device under test (DUT) and the input of the hex buffer.

The section of the circuit schematic designated "POLARITY AND EXTERNAL DISCONNECT SWITCHING CIRCUITS" consists of switches S1, S3 and S4. S1 is a 3-pole 3-position switch. In the external position (EXT) probes P1, P2 and P3 to the DUT are connected to the external posts which may go to a transistor, curve tracer or other equipment, and disconnects the internal probe contact and junction detector circuit. In the off position (OFF) the three poles are open circuited. This position is optional. In the internal position (INT), the DUT is connected to the probe contact and junction detector circuit. K1 and K2 are relay switches operated by the 12 volt DC power supply. The off position which is optional is not used with the relay switches as they have only two poles and two positions as noted by FIG. 8.

Switch S3 is a 2-pole, 2-position toggle switch. This switch applies a 0 or 1 voltage level to the device under test (DUT). If contact is made to the device using tungsten probes, or if a silicon chip is being analyzed or clips are connected to a packaged device connected to P1 and P2 or P2 and P3 and contacted, then a 0 or 1 level voltage will be applied to the input of the hex buffer converter section 4, device U1 pin No. 5 or section 5 device U2, pin No. 14. The 0 or 1 light emitting diode (LED) will light under these conditions. The limit of detectibility is determined by the overall sensitivity of this probe contact detector.

Switch S4 is a four-pole, two-position rotary switch. This switch is used to change the polarity of the voltage applied to the DUT, i.e., changing the voltage applied to the junction either forward or reverse biased for a silicon junction a positive voltage (+) applied to the P-dopant side has a forward breakdown voltage from 0.5 to 0.6-volt and the reverse bias breakdown voltage (—) to the P-dopant side can vary from a few volts to hundreds of volts depending upon the resistivity of the doped silicon.

The "SELECTIVITY SELECTOR SWITCH CIRCUIT" contains the sensor switch S2 and selects the sensitivity of the junction detector. In the L0 position the shields of probe cables P1 or P2 (as determined by polarity switches S4) P2 and P3 are connected to an external ground and either P1 or P2 is connected through a dual diode arrangement to chassis.

When switch S2 is in the low sensitivity position all three probes P1, P2 and P3 may be used for detecting continuity to one or more junctions. In the polarity and external disconnect section the polarity switch S4 determines whether P1 or P2 will be connected to the voltage source for a logic 0 = 0 volts or for logic 1 = about 13.0 volts. If probe P1 is the voltage probe then P2 and P3 are the sensing probes and if P2 is the voltage probe then P1 and P3 are the sensing probes as they are connected to the input of the hex buffer converters in sections 4 and 5, pin 5 of U1 and Pin 14 of U2, respectively.

The sensitivity in the L0 position is determined by the input leakage current of the hex buffer converters, the leakage current of the device under test (DUT), the magnitude of the hysteresis voltage and the threshold levels that cause a 0 or 1 indication in the output of the hex buffer converters. The switching characteristics of the hex buffer converters will determine at what level of voltage a transfer from a 0 to a 1 level will occur. Also, the higher the power supply voltage applied to $V_{CC}$ and $V_{DD}$ of the hex buffers, the higher the voltage level required for switching from a 0 to a 1 level as noted in the graph of FIG. 4.

Increased sensitivity is obtained in the HI position of switch S2 by the injection of a positive pulse signal on the DC level. This is accomplished by the 2.2 megholm resistor and 330 picofarad capacitor combinations R4, C3 and R5, C2. The common center of these is connected to pin 14 of U2 in section 5. One side of this parallel combination is connected to external ground through one section of switch S2. The other side of the other combination is connected to the shielded cable of either probe P1 or P2 and P3 through the other section of switch S2. This permits making contact with a junction that has a smaller reverse bias leakage current as the same level of input voltage at pin 5 of U1 is necessary to obtain a logic 1 output level for either the L0 of HI sensitivity position.

The section designated "HEX BUFFER CONVERTER C/MOS CIRCUIT U1" contains the hex buffer converter — C/MOS integrated circuit U1-type CD4009A. This circuit is fabricated in a 16 pin dual-in-line package. Pins 1 and 16 ($V_{cc}$ and $V_{dd}$) are connected together. These pins are the power supply connections and the recommended operating voltage is from +3 volts to +15 volts.

Figure 9:
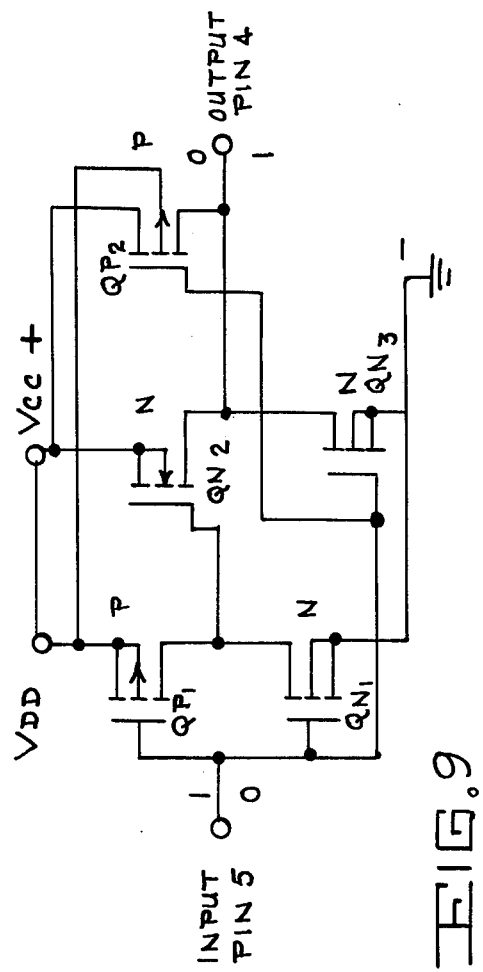
FIG. 9 is a schematic diagram of a C/MOS buffer stage.

The first buffer B1 of U1 is the input stage with external pins 5 and 4 where pin 5 is the input and pin 4 is the output. This buffer stage accepts the input signal which has been applied to the DUT at P1 and P2. If the level at the input pin 5 is 0 then the level at the input pin 5 is 0 then the output at pin 4 is a 1 or inverted level. A schematic diagram of 1- stage is shown in FIG. 9.

An explanation of this stage and the other identical stages is as follows. This circuit (FIG. 9) contains two P-channel QP1, QP2 and three N-channel (QN1, QN2, QN3) MOS transistors. If a 0 or (0 to $V_1$) voltage is applied to the input pin 5 the upper left hand P-channel transistor QP1 is turned on. This causes conduction in this transistor and it applies a positive voltage to the upper middle N-channel transistor QN2. When this transistor is turned on the ($V_{DD}$ - $V_{CC}$) power supply voltage appears at the output pin 5 as a logic level 1. As the two lower N-channel transistors QN1, QN3 are turned off preventing current flow and thus a high level 1 appears at the output of this stage.

If a 1 or high voltage ($V_2$ to $V_{DD}$) is applied at the input pin 5, the lower two N-channel transistors QN1, QN3 are turned on and the upper P-channels and N-channel transistors QP1, QP2, QN2 are turned off. As the lower right hand N-channel transistor QN3 is on and one side is at ground potential, this places a 0 voltage in output pin 4. For all subsequent stages the operation is identical.

Referring again to FIG. 1, the upper 2-buffers B2, B3 are tied in parallel to increase the drive current for the LEDs. Thus when a 0 logic level is at the input pin 5 a 0 logic level will appear at the output pins 2 and 15. This causes current to flow through the 0 level light emitting diode LED1 from the $V_{DD}$ power supply through the N-channel transistors to ground. This 0 level is applied to the inputs of pins 7 and 9 of the next 2-buffers B5, B6. The 1 level light emitting diode in the output of pins 6 and 10 will not light as there will be no conduction path from the power supply to ground. The buffer stage B4 with pin 11 as an input and pin 12 as an output is utilized as the regenerative feedback circuit and develops the hysteresis voltage at the input of pins 3 and 14 through the feedback resistor R5 with 33,000 ohms of resistance.

In the case of a 1 level at the input of pin 5, a 0 level will appear at the output of pin 4, and a 1 level appears at the outputs of pins 2 and 15. This 1 level voltage is applied to input pins 7 and 9 of the lower right hand buffers B5, B6. Due to the inverting of this level a 0 will appear at the output pins 6 and 10. The 1 level light emitting diode will light as there will be a conduction path from the power supply through the N-channel transistors to ground. Thus if a 0 level voltage appears at input pin 5, the 0 light emitting diode LED1 will light. If a 1 level voltage appears at the input pin 5, the 1 light emitting diode LED2 will light. When the input signal at pin 5 is undefined, the hysteresis voltage will cause both the 0 and 1 LEDs to light, signifying no contact to the DUT. The portion of the schematic diagram of Figure designated "HEX BUFFER CONVERTER C/MOS CIRCUIT U$\mu$" contains an identical circuit to that just described.

A logic 0-1 tone oscillator is incorporated into the apparatus of the invention for ease in using the detector when analyzing a silicon chip during failure analysis.

In in-depth failure analysis of an integrated circuit, the various elements on the chip are probed and analyzed using a high power microscope and transistor curve tracer. The use of the tone oscillator (audio tones) instead of the LEDs permits visual observation of the chip under the microscope while adjusting the tungsten probes and listening for an audio tone. This audio tone indicates contact has been made to the particular element being tested at the same time that a 0 or 1 LED lights, as noted in FIG. 1.

The tone oscillator is illustrated by FIG. 3, and in part includes one wafer of the K2 relay switch. The internal (INT) position of this switch applies the power supply voltagee to the CD4030A exclusive OR gate. The 0 and 1 detected logic levels are connected from the outputs of the logic level converter of FIG. 1 to the forward bias diodes CR1-CR4 to the input of the exclusive OR gate. This integrated circuit contains four identical exclusive OR gates OG1-OG4. These gates are connected as logical comparators with the following truth table where A and B refer to the inputs of the first exclusive OR gate OG1. Here A is input pin 1 and B is input pin 2 and J is the output pin 3.

| A | B | J |
| --- | --- | --- |

-continued

| | | |
|---|---|---|
| 0 | 0 | 0 |
| 1 | 0 | 1 |
| 0 | 1 | 1 |
| 1 | 1 | 0 |

The output signals from the 0 and 1 LEDs are connected in the manner as shown in the schematic of FIG. 3. These signals flow through the forward biased diodes CR1, 2, 3 and 4 to the inputs of the exclusive OR gates and through the internal circuitry to give the proper voltage division. This signal conditioning in turn supplies the proper power supply voltage to the 0 or 1 tone oscillator as determined by the 0 or 1 LED indicator in FIG. 1.

Two tone oscillators using CD4002A C/MOS NOR gates NG1-NG4 are connected to operate in response to the above-described logic circuit. Each tone oscillator consists of two C/MOS inverters connected in an astable multivibrator circuit. This circuit alternates between two stable states of alternating 1's and 0's as the output waveform. The operation of this circuit can be found in many engineering handbooks. This circuit is used for this purpose because it is an economical tone oscillator. By using C/MOS circuits which have high input impedances the use of small capacitors for long time constants is possible. By adding an output transformer and a speaker a convenient audio tone generator is developed.

As discussed previously, these tone oscillators are activated by the 0 and 1 logic levels generated in the probe contact detector circuit.

The probe assemblies of the probe contact detector are important and necessary to the invention. Structural details of the connector cables are shown in FIG. 2, showing the conductors tip jacks, plugs, and the plexiglass insulator. The center conductor of the RG-58A/U cable is connected between the VG-88B/U plugs and the tip jacks. The plexiglass insulator inserts a fixed capacitance between each probe contact. Short lengths of test lead wire are used from the tip jacks to the element being tested. If it is a packaged device, small alligator clips can be attached to the test leads for ease in attaching to the test element. However, if tungsten probes are being utilized to contact a silicon chip then the test leads are connected into the tungsten probe jacks. The RG-58A/U shielded cables are used in the input circuit to maintain a stable hysteresis mode when open circuited. Due to the high sensitivity of the detector the external leads which are connected to the probe station are shielded cables. These are the RG-58A/U coaxial cables indicated and have a normal impedance of 52 ohms and a normal capacitance of 21 pf/ft. It is important that the hookup of the shields be connected precisely as noted as the input is sensitive to stray capacitance and pickup.

Figure 10:
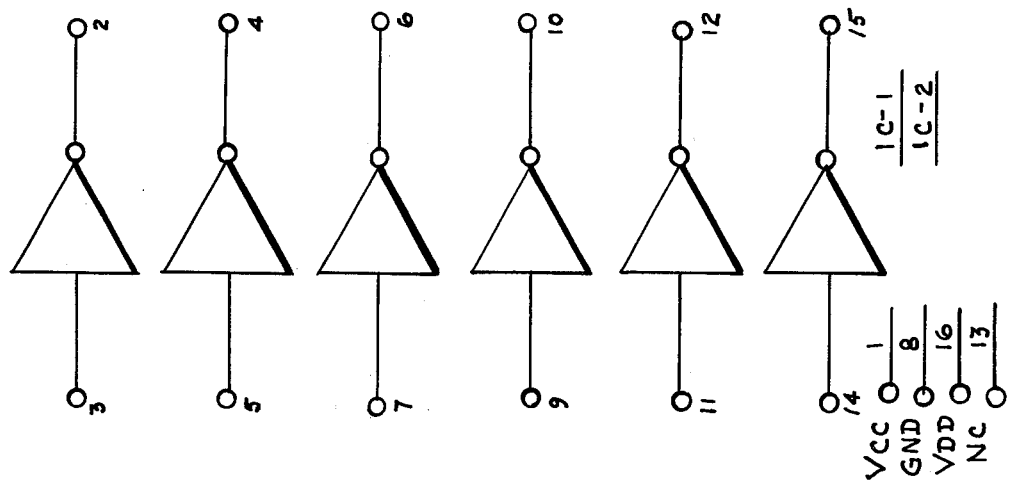
FIG. 10 illustrates the pin connection arrangement of the six hex buffer converters of one logic stage of the invention.

FIG. 10 shows the six hex buffer converters of the CD4009A integrated circuit and the pin connections to the elements.

Figure 8:
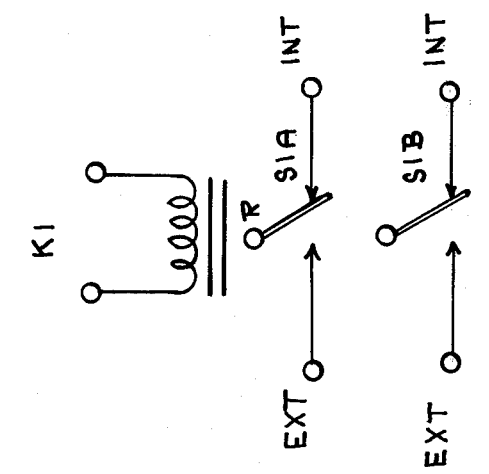
FIG. 8 is a schematic of relay switches used in conjunction with system switching circuits.

FIG. 8 is a schematic of the relay switches that are used in conjunction with switch S1.

The following is a catalogue of the components used in the above-described apparatus.

| PROBE CONTACT DETECTOR | | |
|---|---|---|
| Component | Quantity | Description |
| C2,C3,C4,C5 | 4 | Capacitors 330 pf., 100 WVDC silvered mica |
| C6,C7 | 2 | Capacitors 500 pf., 100 WVDC silvered mica |
| C1 | 1 | Capacitor, Electrolytic 500–1000 ufd. - WVDC - 50 |
| D1 | 1 | Diode, Rectifier - Breakdown voltage 100 volts 1.0 amp rating |
| ZD2 | 1 | Zener Diode - 14 V at 9 ma |
| ZD1 | 1 | Zener Diode - 15 V at 50 ma, 1 watt |
| B1-B6 and B7-B12 | 2 | Integrated circuits, CD-4009A Hex Buffers/Converters |
| LEDs 1,2,3,4 | 4 | Light Emitting Diodes - GaAsP - Red LED. Forward Voltage 1.6 Volts at 20 ma |
| POTs 2,3,4,5 | 4 | Potentiometer 0–1000 ohm, adjustable 1.0 watt |
| POT 1 | 1 | Potentiometer, 0–zokilohms, adjustable 1/2 watt. |
| K1, K2 | 2 | Relays, DPDT, 6 or 12 volt operation rating 100 VDC - 2A |
| R4, R5 | 2 | Resistors 2.2 meghohm, 1/2 watt 10 percent tolerance |
| R6, R7 | 2 | Resistors fixed 33 kilohms, 1/2 watt 10 percent tolerance |
| R2 | 1 | Resistor 100 ohm, 2 watt, 10 percent tolerance |
| R1 | 1 | Resistor - 15 ohm - 1 watt fixed 10 percent tolerance |
| R3 | 1 | Resistor - 100 K ohm |
| | 2 | Sockets IC - 16 pin Dual-In-Line |
| | 4 | Sockets, IC - 14 pin Dual-In-Line |
| S4 | 1 | Switch 4 PDT rotary |
| S3 | 1 | Switch miniature DPDT (no center off) |
| S2 | 1 | Switch, wafer - DPDT |
| T1 | 1 | Transformer, power 120 V AC 60 cycles primary, 12.6 V at .5 amp secondary |
| C9, C19 | 2 | Capacitors .02 ufd - 100 volt paper capacitors |
| C11, C12 | 2 | Capacitors .047 ufd 100 volt paper capacitors |
| OG1 – OG4 | 1 | Integrated circuit CD 4030A Quad Exclusive OR gate C/MOS |
| NG1 – NG4 | 2 | Integrated Circuit CD 4002A Dual 4-Input NOR GATE C/MOS |
| | 3 | 14-pin Dual-In-Line I.C. Sockets |
| R9,R10 | 2 | Resistors 470 KΩ 1/2 watt carbon resistors ± 10 percent |
| CR6 | | Signal diodes Breakdown Voltage >100 volts, $I_R$ - Reverse leakage 1 nanoampere |
| SPR 1,2 | 2 | Speakers, 8 ohms, .500 watt |
| T2,T3 | 2 | Transformers output Primary 600–800 ohms |

-continued

| PROBE CONTACT DETECTOR | | |
|---|---|---|
| Component | Quantity | Description |
| | | Sec. 4, 8, 16 ohms- .200 watts |

While the invention has been described in its preferred embodiment, it is understood that the words which have been used are words of description rather than words of limitation and that changes within the purview of the appended claims may be made without departing from the scope and spirit of the invention in its broader aspects.

What is claimed is:

1. A probe contact and junction detector for microcircuit analysis comprising
    a probe means,
    first and second complementary MOS hex buffer converter logic circuits connected to receive the output of said probe means,
    each said hex buffer converter logic circuit comprising first, second, third, fourth, fifth and sixth buffer stages, each stage having an input and an output, said first buffer stage having its input connected to said probe means and its output connected to the inputs of said second and third buffer stages and through resistance means to the output of said fourth buffer stage, the outputs of said second and third buffer stages being connected to the inputs of said fourth, fifth and sixth buffer stages, and, each said light emitting diode means comprises first and second light emitting diodes, said first light emitting diode being connected between the outputs of said second and third buffer stages and the power supply means, and said second light emitting diode being connected between the outputs of said fifth and sixth buffer stages and the power supply means;
    a light emitting diode means connected to receive and respond to 0 and 1 level logic signals generated by each hex buffer converter logic circuit, and
    power supply means connected to provide a voltage source for said light emitting diode means and for said hex buffer converter logic circuits.

2. A probe contact and junction detector as defined in claim 1 wherein each said buffer stage comprises first and second P-channel MOS transistors and first, second, and third N-channel MOs transistors, the gates of said first and second P-channel and said first and third N-channel transistors being connected to the buffer stage input, the sources and substrates of said first and second N-channel transistors being connected to ground, the drains and substrates of said first and second P-channel and said second N-channel transistors being connected to said power supply means, the source of said first P-channel transistor and the drain of said first N-channel transistor being connected to the gate of said second N-channel transistor, and the drain of said third N-channel transistor and the sources of said second N-channel and said second P-channel transistors being connected to the buffer stage output.

3. A probe contact and junction detector as defined in claim 2 including a tone generator connected in parallel with said light emitting diode means.

4. A probe contact and junction detector as defined in claim 3 wherein said probe means comprises three coaxial cables, three tip jacks, the center conductor of each of said coaxial cables terminating in a tip jack, and a plexiglass mounting head, said tip jacks being mounted in said mounting head and positioned to provide a discrete fixed capacitance between probe contacts.

5. A probe contact and junction detector as defined in claim 4 including a switching means connected to selectively switch the output of said probe means to an alternate microcircuit analysis device.

6. A probe contact and junction detector as defined in claim 5 including a sensitivity switch connected to selectively disconnect said second complementary MOS hex buffer converter logic circuit from the output of said probe means.

7. A probe contact and junction detector as defined in claim 6 including a polarity switch connected to selectively reverse the polarity of the probe means contacts.

* * * * *